(12) United States Patent
Wang et al.

(10) Patent No.: US 7,530,047 B2
(45) Date of Patent: May 5, 2009

(54) OPTIMIZED MAPPING OF AN INTEGRATED CIRCUIT DESIGN TO MULTIPLE CELL LIBRARIES DURING A SINGLE SYNTHESIS PASS

(75) Inventors: Qi Wang, San Jose, CA (US); Ranganathan Sankaralingam, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 120 days.

(21) Appl. No.: 11/447,683

(22) Filed: Jun. 5, 2006

(65) Prior Publication Data

US 2007/0011643 A1 Jan. 11, 2007

(51) Int. Cl.
*G06F 17/50* (2006.01)
(52) U.S. Cl. .................. 716/18; 716/17; 716/3
(58) Field of Classification Search ............. 716/18, 716/17, 3
See application file for complete search history.

(56) References Cited

U.S. PATENT DOCUMENTS

| | | | |
|---|---|---|---|
| 6,574,786 B1 * | 6/2003 | Pohlenz et al. | 716/17 |
| 6,609,244 B2 * | 8/2003 | Kato et al. | 716/18 |
| 6,779,163 B2 * | 8/2004 | Bednar et al. | |
| 6,820,240 B2 * | 11/2004 | Bednar et al. | |
| 6,883,152 B2 * | 4/2005 | Bednar et al. | |
| 7,062,726 B2 * | 6/2006 | Andreev et al. | 716/1 |
| 7,216,329 B2 * | 5/2007 | Kitahara et al. | 716/17 |
| 7,281,230 B2 * | 10/2007 | Chung et al. | 716/11 |
| 7,430,725 B2 * | 9/2008 | Broberg et al. | 716/1 |
| 2002/0157080 A1 * | 10/2002 | Kato et al. | 716/18 |
| 2005/0034095 A1 * | 2/2005 | Bansal | 716/18 |
| 2005/0039156 A1 * | 2/2005 | Catthoor et al. | 716/18 |
| 2005/0097494 A1 * | 5/2005 | Kitahara et al. | 716/11 |
| 2007/0294654 A1 * | 12/2007 | Chung et al. | 716/11 |

OTHER PUBLICATIONS

Goodby et al., "A High-Level Synthesis Methodology for Low-Power VLSI Design", IEEE Symposium on Lower Power Electronics, Oct. 10-12, 1994, pp. 48-49.*

* cited by examiner

*Primary Examiner*—Phallaka Kik
(74) *Attorney, Agent, or Firm*—Stephen C. Durant; Duane Morris LLP

(57) ABSTRACT

A circuit design synthesis method is provided comprising: associating a first cell library with a first block of a circuit design; associating a second cell library with a second block of the circuit design; specifying at least one constraint upon the overall circuit design; mapping a portion of the first block to a cell in the first cell library based upon the at least one constraint in view of a step of mapping a portion of the second block to a cell in the second cell library; and mapping a portion of the second block to a cell in the second cell library based upon the at least one constraint in view of the step of mapping a portion of the first block to a cell in the first cell library.

20 Claims, 5 Drawing Sheets

OPTIMIZED MAPPING OF AN INTEGRATED CIRCUIT DESIGN TO MULTIPLE CELL LIBRARIES DURING A SINGLE SYNTHESIS PASS

BACKGROUND OF THE INVENTION

1. Field of the Invention

The invention relates to the design of electronic circuits and more particularly to optimized mapping of a higher level design to multiple cell libraries.

2. Description of the Related Art

Synthesis of an integrated circuit design involves a process of translation of a behavioral description of the design to a structural description of the design optimized according to one or more constraints. A designer ordinarily sets forth a behavioral description of a design in a high level descriptive language such as Verilog or VHDL, or describes a model of the design in the C or C++ programming language, for example. In general, a behavioral description provides a register transfer level (RTL) model of a design is a description of a circuit design in terms of data flow between registers, which store information between clock cycles in a circuit. An RTL description specifies what and where this information is stored and how it is passed through the circuit during its operation.

In one aspect, a synthesis process converts a behavioral description of a design to a structural description in terms of a netlist, for example. Optimization techniques typically are employed in the conversion of the behavioral description to the gate level description. In another aspect, a synthesis process, maps a design to a cell library. A cell represents a circuit element that is available in a particular implementation technology, and a cell library is a collection of these cells. A cell library may comprise a few hundred cells corresponding to primitive circuits, such as inverters, NAND gates, NOR gates and possibly to more complex Boolean circuits and perhaps, to sequential elements like latches and flip-flops, for which optimized models have been designed for a particular purpose, such as for operation at a particular voltage level, for example. Optimization techniques also typically are employed in the mapping of gates in a netlist to cells in a technology model.

Multiple Supply Multiple Voltage (MSMV) is an architectural-level power optimization technique to reduce dynamic power (also known as active power) dissipation in integrated circuit devices. The MSMV design style exploits the well-known quadratic relationship between supply voltage and dynamic power. Pedram, M.; Abdollahi, A., Low-power RT-level synthesis techniques: a tutorial, IEEE Proc. Comp. Dig. Tech., May 2005. Advanced techniques such shutoff and wakeup, multiple voltage islands Sun Microsystems, "UltraSPARC T1 Overview," at (worldwide web).sun.com/processors/UltraSPARC-T1, dynamic voltage scaling, Lackey, D. E et al, "Managing power and performance for system-on-chip designs using Voltage Islands," ICCAD 2002; Montanaro, J. et al, "A 160-MHz, 32-b, 0.5-W CMOS RISC microprocessor," Solid-State Circuits, IEEE Journal of, vol. 31, no. 11, pp. 1703-1714, November 1996, have been developed to address these issues.

A MSMV design typically includes multiple blocks or regions having different supply voltages such that the overall chip power dissipation can be minimized while balancing other performance targets such as timing area requirements. In general, switching power dissipation is proportional to the square of the supply voltage, the lower the supply voltage, the lesser the power dissipation. Thus, a reduction in supply voltage leads to a corresponding reduction in switching power dissipation. However, a lower the supply voltage also results in a slower circuit. Therefore a challenge has been to reduce the power dissipation without reducing circuit performance.

In general, MSMV is applicable in any situation in which a slow block in a design is interfaced to a faster block in the design. For example, a typical system on a chip (SoC) includes several blocks and also may have multiple clock domains, with the domains possibly operating at different frequencies. To save active power, blocks that are not performance critical can be clocked at a lower frequency than performance critical blocks. This leads to a linear reduction in power for those blocks. While power consumption is reduced due to frequency reduction, it is possible to reduce supply voltage further. Since gate delays increase as the supply voltage decreases, for any target frequency, it is possible to discover the minimum supply voltage that is required to sustain that target frequency. Since active power depends on the square of supply voltage, even small reductions in supply voltage can result in large reductions in active power.

MSMV also can be applied in situations in which there is only one clock domain. For instance, consider two blocks with a producer-consumer relationship. One example is a decryption block whose data is consumed by a CPU block. In that situation, the same clock could drive both blocks. If the decryption algorithm is sufficiently simple, it is possible to have large positive slack in the decryption block while the CPU block has zero slack (timing is just met). In such a situation, the decryption block cannot be clocked at a lower frequency, because both blocks are driven by the same clock. But the positive slack in the decryption block can be exploited to reduce the supply voltage to the decryption block.

MSMV also is useful is when a pipelined block is interfaced to a non-pipelined block. Pipelined blocks are specifically designed to operate at high frequencies. Hence, the pipelined block often will have significant positive slack. Therefore, supply voltage to the pipelined block sometimes can be reduced to use up all the positive slack, resulting in power savings.

During synthesis of a MSMV design, gates in a design that operate at different voltages are mapped to different library cells. For instance, one library cell may have timing and power characteristics for one supply voltage used in the design, and another library cell may have timing and power characteristics for another supply voltage in the design. A gate in the design may be mapped to one or the other of the two library cells depending upon the supply voltage at which the gate to be mapped operates. Library vendors often characterize cells at different voltages and create separate libraries for each voltage. Thus, cells corresponding to the same functionality, or logic gate, at two different voltages would be found in two different libraries.

FIG. 1 is an illustrative flow diagram of a prior technology mapping and optimization process 100. The process 100 involves multiple mapping and optimization passes 108-1 to 108-n. Different passes map different blocks of the a design to different libraries. In step 102, an RTL description of the design is obtained, i.e., an RTL file is stored in memory accessible to the processor performing the mapping and optimization process. In step 104, the design is partitioned into blocks that use one supply voltage each. In step 106, block level timing constraints are derived. Next, multiple mapping and optimization passes 108-1 to 108-n are performed. In this example, the design is assumed to have been partitioned into n blocks, and a separate mapping and optimization pass is performed for each block. In a first step, 110-1 to 110-n of each pass 108-1 to 108-n, respective design information for the block (e.g., RTL) and a respective library to be used for the block (i.e., the cell library characterized for the supply voltage used by the block) is accessed. In a second step, 112-1 to 112-n of each pass 108-1 to 108-n, the respective design information for the respective block is mapped to the appropriate cells of the respective library. The result of the multiple passes 108-1 to 108-n is multiple blocks that have been mapped to multiple libraries. In step 114, the multiple mapped blocks are reassembled into the single design. In decision step 116 and analysis is made as to whether the reassembled design meets the constraints set in step 106. If yes, then the process stops. If no, then in decision step 120, a determination is made as to whether to perform a different partition. If yes, then the process returns to step 104. If no, then the process returns to step 106.

While prior approaches to mapping and optimization of MSMV designs generally have been acceptable, there have been drawbacks. For instance, as illustrated in the above example, each block of the design that used a different supply voltage typically was mapped and optimized in a separate synthesis pass. Thus, technology mapping of the entire chip design did not occur a single run. Moreover, a user could not run timing or power analysis at the full chip level during mapping and optimization to check whether timing and power goals had been met.

Also, the prior approach is inefficient since multiple passes typically will be required to meet design targets. The process involves partitioning the design into smaller blocks and deriving timing and power constraints for each block. The quality of the derived timing and power constraints for each block influences the quality of the overall result. The challenge is to apportion timing and power constraints across the multiple blocks so that the resultant design meets design targets. This can be a difficult challenge. If block-level target constraints turn out to be too tight, then the resulting IC chip will have a larger area and consume more power than an optimal solution. If block-level target constraints are too lenient, then timing will not be met at the top-level (when the blocks are reassembled), and another iteration of time budgeting and synthesis will be required. Moreover, since blocks are optimized individually in separate passes, even if each block meets its individual timing and power constraints, the overall reassembled design still may not meet the design targets, since the blocks are not optimized relative to each other.

Thus, there has been a need for improvements in the mapping and optimization of a circuit design to multiple cell libraries. The present invention meets this need.

DETAILED DESCRIPTION OF THE EMBODIMENTS

The following description is presented to enable any person skilled in the art to make and use a system and method for optimized mapping of a higher level design to multiple cell libraries during a single synthesis pass in accordance with embodiments of the invention, and is provided in the context of particular applications and their requirements. The following description also describes a novel data structure comprising a design mapped to multiple library domains. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known structures and processes are shown in block diagram form in order not to obscure the description of the invention with unnecessary detail. Thus, the present invention is not intended to be limited to the embodiments shown, but is to be accorded the widest scope consistent with the principles and features disclosed herein.

Figure 1:
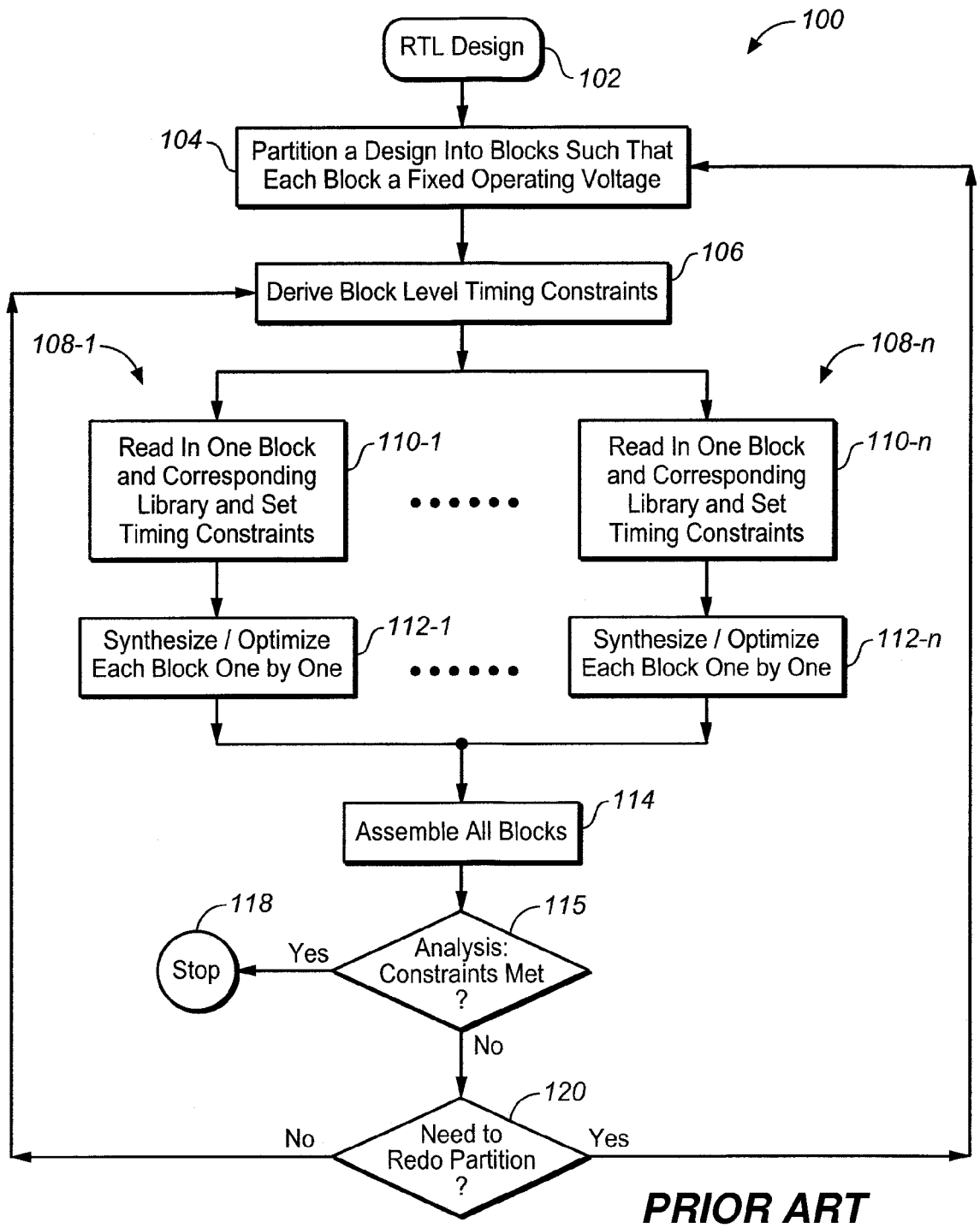
FIG. 1 is an illustrative flow diagram of a prior technology mapping and optimization process.
Figure 2:
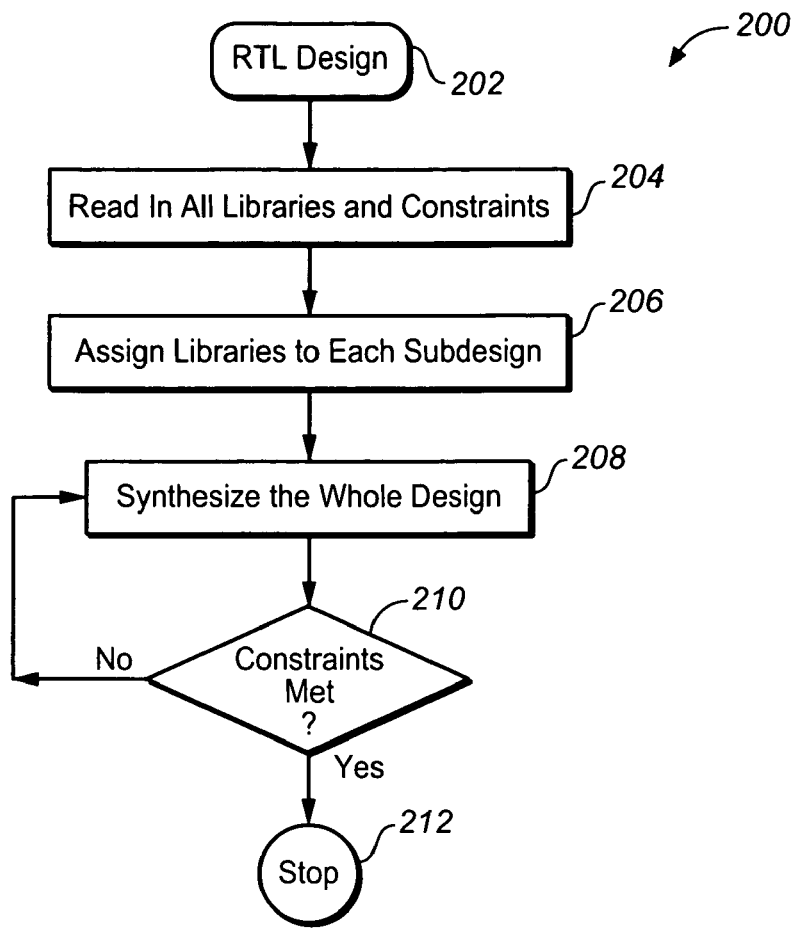
FIG. 2 is an illustrative flow diagram of a process to optimize mapping of a design to multiple cell libraries in accordance with some embodiments of the invention.

FIG. 2 is an illustrative flow diagram of a process 200 to optimize mapping of a design to multiple cell libraries in accordance with some embodiments of the invention. In step 202 a design (e.g., in RTL) is accessed (e.g., read into memory of the processor performing the synthesis process). In step 204, multiple (voltage) libraries are accessed where each library is characterized for a different supply voltage, and design constraints are assigned (e.g., by a user) for the overall design. That is, the constraints are provided for the entire design, rather than for individual blocks in the design. The constraints determine design targets such as for timing, area, or power consumption, for example. In step 206, the libraries are assigned to blocks of a design. In step 208, synthesis is performed to map the design to the assigned libraries. In decision step 210, an analysis is made as to whether the mapped design overall meets the constraints. If no, then the process proceeds to step 208, and tries a different mapping. If yes, then the process stops 212.

The iteration of steps 208 and 210 comprise an optimization/analysis process directed by the assigned constraints. The iteration of steps 208 and 210 can be similar to that of a traditional synthesis process involving a single voltage library. As a result, optimization techniques developed for a traditional single voltage design flow can be applied to the multiple library process 200. Moreover, there is no need to develop block-level constraints. Thus, in one embodiment, a process in accordance with the invention permits simultaneous optimization of timing and power across different blocks of a circuit that use different cell libraries.

Characteristics of a library cell may include: operating voltage, threshold voltage, area, power consumption and delay, to name a few examples. For example, for an inverter INVX1, may appear three times in three different libraries, characterized for voltage of 0.5 volt, 0.8 volt and 1.0 volt respectively. Because the supply voltage applied is different in each library, the delay and power dissipation model will be different for each library. As a result, the power and timing analysis is different for the same inverter INVX1 under different libraries (or voltages).

Optimization involves changing a mapping of a portion of the design so as to come closer to achieving one or more target constraints. For instance, an optimization step may involve buffer insertion or removal to increase or decrease the delay of a path in the design. An optimization step may involve resizing a gate to increase speed or to reduce area. An optimization step may involve a pin-swap or restructuring (e.g., mapping part of the design to different gates). In each optimization step in which a decision is made as to whether to add/replace/change a mapping of a cell, the mapping is chosen such that characteristics of the mapped cell are optimal in view of the constraints on the overall design and such that the cell belongs to the library which has been associated with the block containing the gate mapped to the cell.

Analysis involves calculation of a specified cost associated with a design. For instance, analysis may involve calculation of cost in terms of power, speed or area. The power/area/delay information for a cell mapped to a design is provided in the library containing the cell. A synthesized design comprises instances of library cells. When the power/area/delay report for a full design is to be generated, information for each instance is looked up from the library which has been assigned to the block mapped to the library. Analysis results are used to determine whether a design is improving as a result of the optimization steps and whether further optimization is needed.

It will be appreciated of course that not every block in a MSMV design uses a different supply voltage. In general, designers write RTL for different modules. One module can be contained in another module. A design may have a unique top module. Ideally during synthesis it will be possible to synthesize/optimize a design from the top module. However, for various reasons, this is not always the case. For example, memory capacity limitations or the difficulty of handling of multiple voltage libraries may cause users break a top module into several independent modules. Each such module is called a block. The RTL code may be annotated to demarcate blocks in a design. The synthesis tool reads in the blocks one by one, associates the blocks with libraries, and performs the mapping and optimization.

Figure 3:
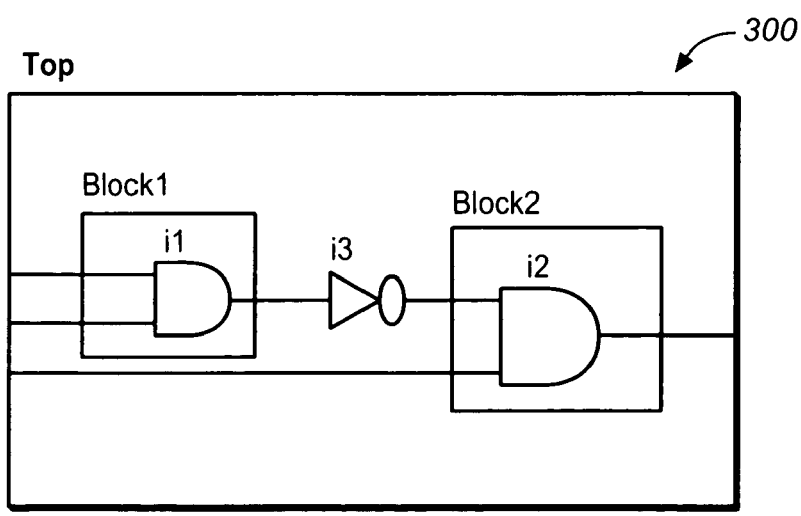
FIG. 3 is an illustrative schematic diagram of a circuit design that can be mapped and optimized during a single synthesis pass in accordance with some embodiments of the invention.

FIG. 3 is an illustrative schematic diagram of a circuit design 300 that can be mapped and optimized (i.e., the mapping can be changed) during a single synthesis pass in accordance with an embodiment of the invention. The design 300, which is named 'Top', includes two blocks 'block1' and 'block2'. Block1 includes an and-gate named 'i1', which is a portion of the block1. Block2 includes an and-gate with name 'i2', which is a portion of block2. The design 'Top' also includes an inverter named i3. Assume that there are two libraries, lib_0.8 v and lib_1.0 v, which contain the same cells but characterized at voltage of 0.8 v and 1.0 v respectively. Further assume that 'lib_0.8 v' has been assigned to block1 and that 'lib_1.0 v' has been assigned to block2. Also, assume that that there is a cell named ANDX1 (not shown) in both libraries lib_0.8 v and lib_1.0 v and that both i1 and i2 are instances of the cell named ANDX1.

A mapping and optimization process in accordance with an embodiment of the invention the analysis step would report different cell delay and power for i1 and i2 since they operate at different voltages even though they are instances of the same cell ANDX1. During optimization in accordance with an embodiment of the invention, the optimization step is aware of the differences in the power and delay characteristics of the two instances of the same cell based upon the different information in lib_0.8 v and lib_1.0 v. Accordingly, the optimization step can decide which of the two cells i1 and i2 is the best to optimize. In other words, it decides upon the mapping of i1 in view of the mapping of i2, and it decides the mapping of i2 in view of the mapping of i1. More specifically, for example, if the synthesis tool wants to speed up the path along the i1/i2/i3, it can size up both i1 and i2. However, based on the timing characteristics from lib_1.0 v and lib_0.8 v, it may be that sizing up i2 leads to better results than sizing up i1. The optimization step selects the optimization move that produces the best optimization result.

In contrast, in the prior approach, 'block1' and 'block2' were synthesized separately, and the two blocks were reassembled to the design afterwards. During synthesis for block1, the synthesis process had no knowledge about block2 and vice versa. As a result, the prior process could make an optimization move that was best for block1 or for block2, but not one that was optimal for the design as a whole. Consequently, optimization results often were not as good.

Figure 4:
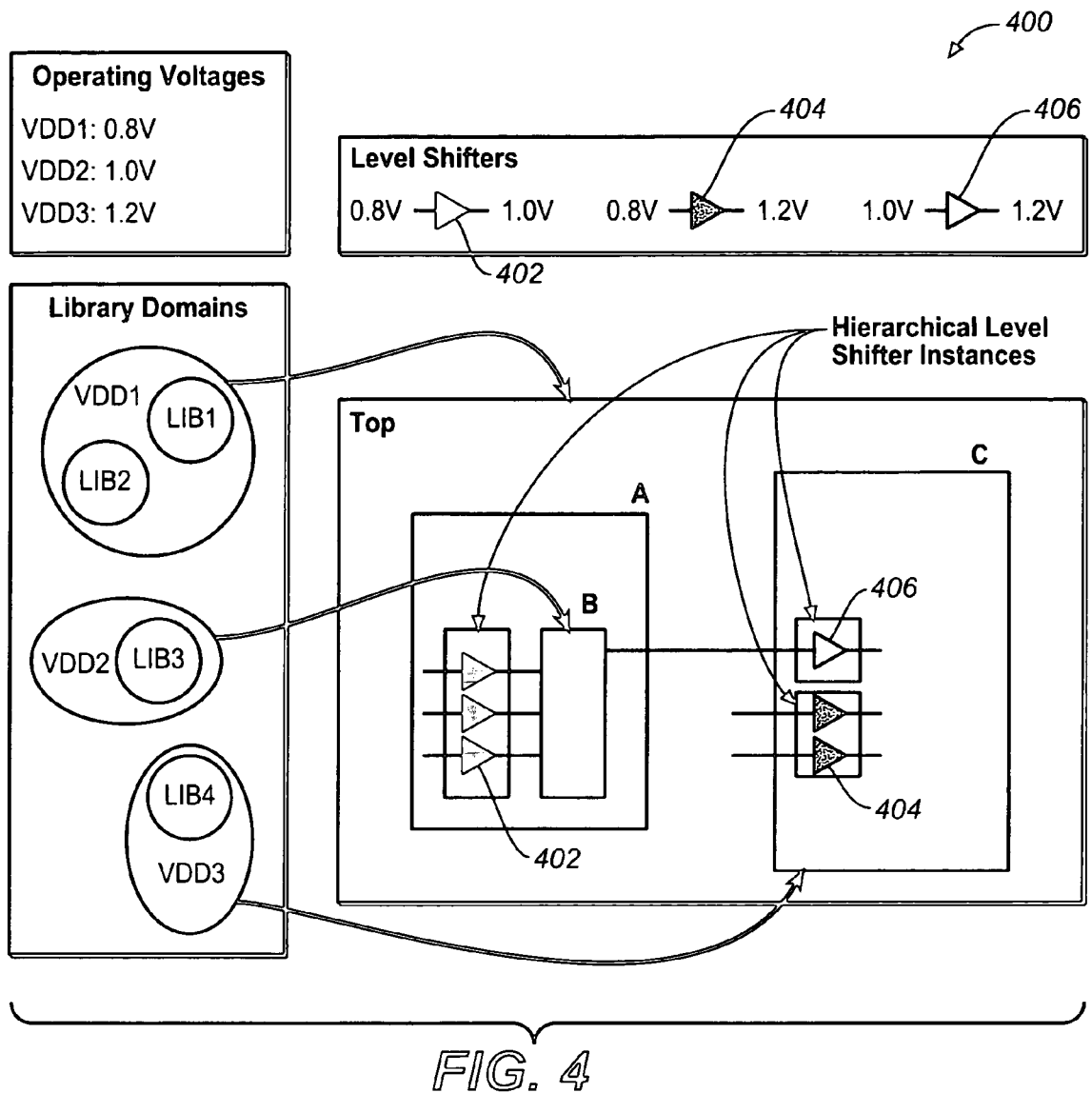
FIG. 4 is an illustrative block diagram of a data structure representing a Multiple Supply Voltage (MSV) design including individual blocks associated with different voltage library domains, which in turn are associated with different cell libraries in accordance with an embodiment of the invention.

FIG. 4 is an illustrative block diagram of a data structure 400 representing a Multiple Supply Voltage (MSV) design 401 including individual blocks associated with different voltage library domains, which in turn are associated with different cell libraries in accordance with an embodiment of the invention. The design calls for multiple supply voltages for the core logic. A 'Top' design and subdesign (or block) 'A' operate on voltage VDD1 while subdesign (or block) 'B' operates on voltage VDD2 and subdesign 'C' operates on voltage VDD3. The libraries are characterized for a particular set of operating conditions, such as voltage. Therefore, blocks operating on different voltages use libraries that were characterized for that particular voltage.

In accordance with some embodiments of the invention, libraries that are characterized for the same nominal operating conditions are grouped together in a library domain. FIG. 4 shows a library domain with a corresponding name was created for each voltage. Libraries LIB1 and LIB2 are associated in computer readable memory with library domain VDD1. Library LIB3 is associated in computer readable memory with library domain VDD2. Library LIB4 is associated in computer readable memory with library domain VDD3. The association in computer readable memory of library domains with different portions of the design indicates the voltage on which these portions are operating. Thus, the single data structure 400 can be used to achieve mapping and optimization of an entire design in one synthesis pass in accordance with an embodiment of the invention.

Level shifters are used to pass data signals between portions of the design that operate on different voltages. Because level shifter cells are usually characterized for the different voltages they operate between, level shifter cells should be identified for all appropriate library domain pairs. Level shifter cells that can be used for a specific library domain pair, are grouped in a level shifter group. In the example of FIG. 4, three groups of level shifters were defined, 402, 404 and 406.

Figure 5:
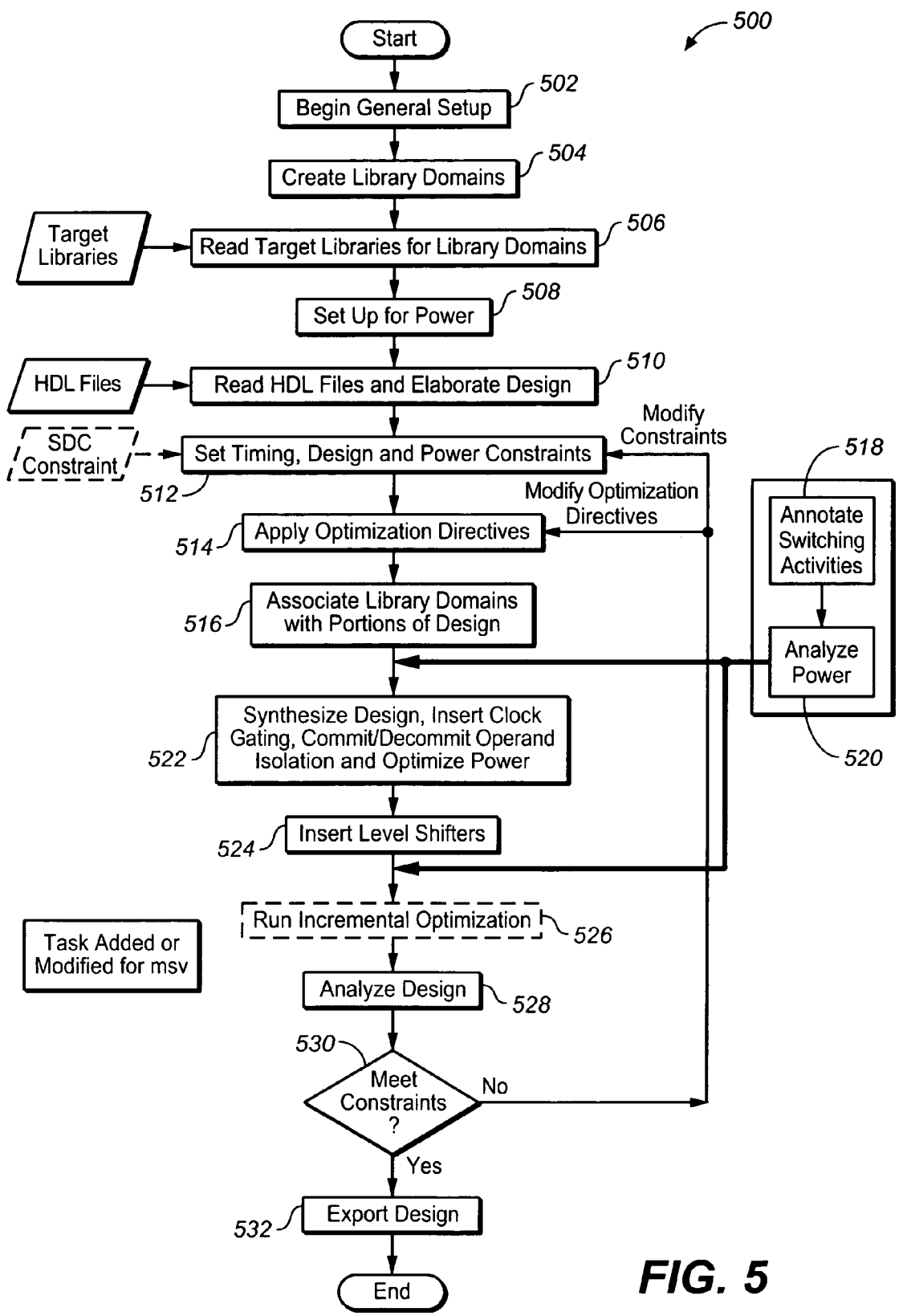
FIG. 5 is an illustrative flow diagram of a computer program based process 500 to optimize mapping of a Multiple Supply Voltage (MSV) design such as that of FIG. 4, to multiple voltage cell libraries in accordance with some embodiments of the invention.

FIG. 5 is an illustrative flow diagram of a computer program based process 500 to optimize mapping of a Multiple Supply Voltage (MSV) design such as that of FIG. 4, to multiple voltage cell libraries in accordance with some embodiments of the invention. The computer program based process of FIG. 5 is embedded in a computer readable medium, so as to interact with a computer system to cause the system to effect the steps set forth in the process. In step 502, computer program instructions specify paths for to search for libraries, scripts, and HDL files, for example. In step 504, computer program instructions effect creation of library domains. A library domain is a collection of libraries characterized for the same nominal operating conditions (and thus the same supply voltage). A library domain is created for each supply voltage used in the design. A directory path is returned for each library domains that is created. In step 506, computer program instructions associate libraries that are characterized for a specific set of operating conditions with the library domain that corresponds to that supply voltage. In a present embodiment, there is no limitation on the number of libraries that can read in per library domain.

In step 508, computer program instructions set up the process for low power optimization. In one embodiment, setting up for low power involves one or more of the following: ensuring that clock-gating logic is inserted during synthesis; ensuring that operand-isolation logic is inserted during synthesis; selecting a clock-gating integrated cell that is available in the library; and controlling the clock gating. In step 510, computer program instructions cause HDL (hardware description language) files describing a design to be read in to computer memory. Raw HDL text is elaborated to transform it to a suitable form for synthesis. During elaboration, registers for clock gating are identified. Also, data path block candidates (such as adders and multipliers) for operand isolation and inserts operand isolation instances. In step 512, timing, design and power constraints are set for the design. In step 514, optimization directive such as target clock rate at which the design should operate, disabling of false paths, combining paths into groups in order to selectively optimize certain blocks more aggressively than others are set.

The invention is not related to the details of low power optimization, design elaboration, constraints or optimization directives, and persons of ordinary skill in the art will readily understand the details. Therefore, these are not discussed further.

In step 516, computer program instructions direct a process that creates a data structure such as that of FIG. 4. For example, referring to FIG. 4 block 'A' operates at VDD1. Therefore, instructions in step 516 cause block 'A' to become associated with library domain VDD1, which has been associated with LIB1 and LIB2. Thus, block 'A' is associated in computer memory with LIB1 and LIB2 via library domain VDD1, which contains LIB1 and LIB2. Similarly, block 'B' operates at VDD2, and therefore, instructions in step 516 cause block 'B' to become associated with library domain VDD2. Thus, block 'B' is associated in computer memory with LIB3 via library domain VDD2, which contains LIB3. Likewise, block 'C' operates at VDD3 and therefore, instructions in step 516 cause block 'C' to become associated with library domain VDD3. Thus, block 'C' is associated in computer memory with LIB4 via library domain VDD3, which contains LIB4.

In step 518, switching activities are annotated prior to power analysis for a more accurate power calculation. In step 520, RTL power is analyzed. During RTL power analysis, an approximate estimate of the power consumption of the design after mapping is calculated before the mapping process starts. This is useful to enable designers to know the relative power consumption of different blocks.

In step 522, after the constraints and optimizations have been set for the design, computer program instructions cause the design to be synthesized. During synthesis, the different portions of the design that are associated with different library domains will be mapped to the target libraries of those library domains and optimized. Clock-gating insertion, commitment and decommitment of the operand isolation instances, and leakage and dynamic power optimization occur automatically during mapping and optimization.

In step 524, computer program steps cause insertion of level shifters in the design. In particular, level shifters are inserted in the design where data signals between library domains representing different voltages. FIG. 4 shows level shifters 402, 404 and 406 inserted between voltage domains. In step 526, incremental synthesis is performed to fix timing problems resulting from the insertion of the level shifters.

In step 528, computer program instructions cause a computer to perform an analysis of the design to determine whether it meets target performance. In decision step 530, a determination is made as to whether the design meets constraints. If no, the process returns to step 512 and new timing, design and power constraints may be set. Target clock rates can be reduced, more paths may get added to the false path list, some groups of paths may be less aggressively optimized, the maximum target power can be reduced. If yes, then in step 532, the design is exported (e.g., to a physical placement tool) and the process ends.

Figure 6:
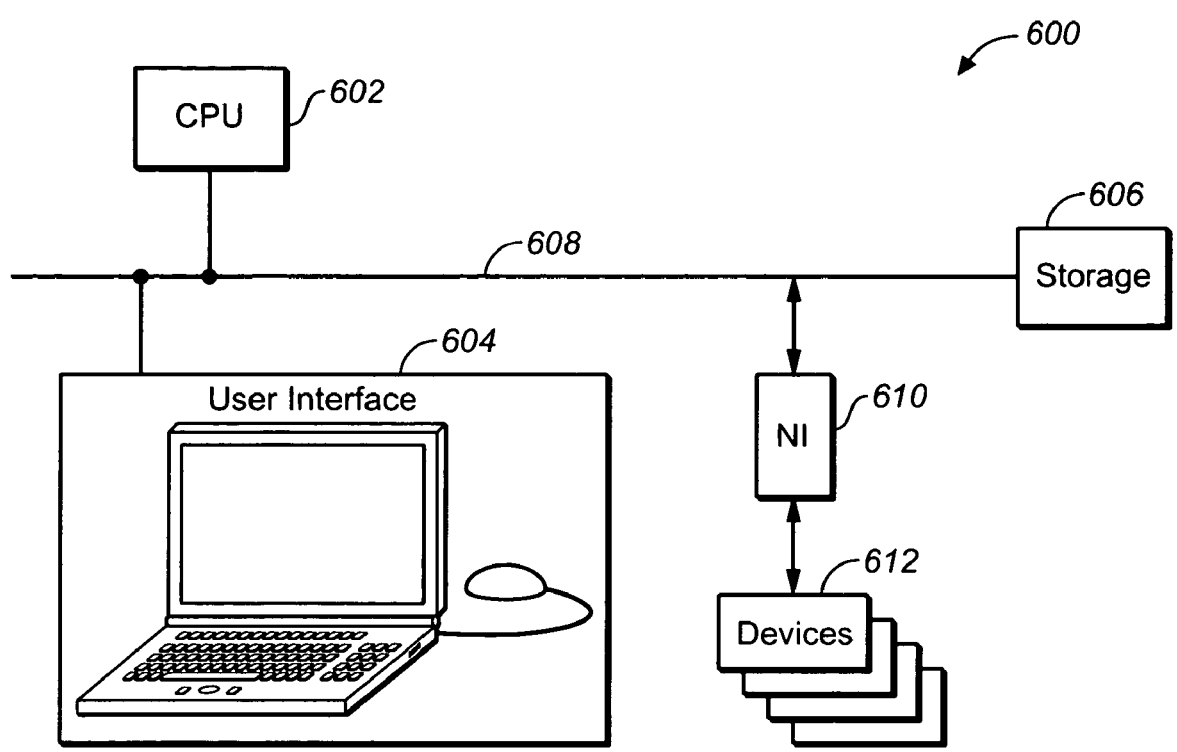
FIG. 6 is a schematic drawing of an illustrative computer system that can produce a novel data structure comprising a design mapped to multiple library domains and that can run a novel process for optimized mapping of a higher level design to multiple cell libraries during a single synthesis pass in accordance with embodiments of the invention.

FIG. 6 is a schematic drawing of an illustrative computer system 600 that can run a novel process for optimized mapping of a higher level design to multiple cell libraries during a single synthesis pass in accordance with embodiments of the invention. The computer system 600 includes one or more central processing units (CPU's) 602, a user interface 604, computer readable storage media 606, a system bus 608, and one or more bus interfaces for connecting the CPU, user interface, memory and system bus together. The computer system also includes a network interface 610 for communicating with other devices 612 on a computer network.

Computer readable code such as code for implementing the processes of FIGS. 2 or 5 can be stored in storage memory 606 and used to control the CPU 602. Moreover, a data structure representing a design mapped to multiple library domains such as the data structure 400 of FIG. 4 can be stored in storage memory 606. The computer program instructions can cause the CPU 602 to produce the data structure 400 of FIG. 4 and to map and optimize the design 401 of the data structure 400 of FIG. 4 using multiple libraries in a single synthesis pass.

It will be understood that the foregoing description and drawings of preferred embodiment in accordance with the present invention are merely illustrative of the principles of this invention, and that various modifications can be made by those skilled in the art without departing from the scope and spirit of the invention.

What is claimed is:

1. A circuit design synthesis method comprising:

associating a first block of a circuit design with a first cell library;

associating a second block of the circuit design with a second cell library;

specifying at least one constraint upon the circuit design in its entirety;

synthesizing the circuit design, including synthesizing both the first block and the second block, in the course of synthesizing the first block, mapping a portion of the first block to a cell in the first cell library based upon the at least one constraint in view of a step of mapping a portion of the second block to a cell in the second cell library; and in the course of synthesizing the second block, mapping a portion of the second block to a cell in the second cell library based upon the at least one constraint in view of the step of mapping a portion of the first block to a cell in the first cell library.

2. The method of claim 1 further including:
associating the first cell library with a first library domain of a plurality of library domains;
associating the second cell library with a second library domain of the plurality;
associating the first block with the first library domain; and
associating the second block with the second library domain.

3. The method of claim 1 further including:
associating a third cell library with a first library domain.

4. The method of claim 1 further including:
optimizing the synthesis of the design by selectively optimizing either the mapping of the portion of the first block or the mapping of the portion of the second block based upon the constraint.

5. The method of claim 4, wherein the optimizing comprises one or more of inserting or removing a buffer, resizing a gate, and restructuring a portion of either the first block or the second block.

6. The method of claim 1 further including:
evaluating whether the design satisfactorily meets the at least one constraint:
while the design does not satisfactorily meet the at least one constraint, continuing to optimize the mapping of at least one of a portion of the first block to a cell in the first cell library or a portion of the second block to a cell in the second cell library based upon the constraint.

7. The method of claim 6,
iteratively performing the evaluating and optimizing steps.

8. The method of claim 1, wherein the first block is associated with the first cell library to an exclusion of association with the second cell library, such that synthesis of the first block does not involve using cells obtained from the second cell library.

9. The method of claim 8, wherein at least one cell of the first cell library has a shared cell name with at least one cell of the second cell library, and the synthesis causes any instance having the shared name in the first block to be characterized based on first cell library information, and any instance having the shared name in the second block to be characterized based on second cell library information.

10. The method of claim 1, wherein the second block is associated with the second cell library to an exclusion of association with the first cell library, such that synthesis of the second block does not involve using cells obtained from the first cell library.

11. The method of claim 10, wherein at least one cell of the second cell library has a shared cell name with at least one cell of the first cell library, and the synthesis causes any instance having the shared name in the second block to be characterized based on second cell library information, and any instance having the shared name in the first block to be characterized based on first cell library information.

12. A computer readable memory encoded with data produced by a method comprising the steps of:
saving to the computer readable memory an association between a first cell library and a first block of a circuit design;
saving to the computer readable memory an association between a second cell library and a second block of the circuit design;
synthesizing the circuit design, including synthesizing both the first block and the second block, the synthesizing including mapping a portion of the first block to a cell in the first cell library based upon the at least one constraint in view of a step of mapping a portion of the second block to a cell in the second cell library; and
mapping a portion of the second block to a cell in the second cell library based upon the at least one constraint in view of the step of mapping a portion of the first block to a cell in the first cell library; and
saving synthesis outputs to the computer readable memory.

13. The computer readable memory of claim 12 wherein the method further comprises the step of:
saving to the computer readable memory an association between a third cell library with a third block of the circuit design.

14. The computer readable memory of claim 12 wherein the method further comprises the steps of:
saving to the computer readable memory an association between the first cell library with a first library domain; and
saving to the computer readable memory an association between the second cell library with a second library domain.

15. The computer readable memory of claim 12 wherein the method further comprises the steps of:
saving to the computer readable memory an association between a third cell library with a third block of the circuit design;
saving to the computer readable memory an association between the first cell library with a first library domain;
saving to the computer readable memory an association between the second cell library with a second library domain; and
associating the third cell library with a third library domain.

16. The computer readable memory of claim 12 wherein the method of forming the data structure further comprises the steps of:
saving to the computer readable memory an association between a third cell library with a second block of a circuit design;
saving to the computer readable memory an association between the first cell library with a first library domain;
saving to the computer readable memory an association between the second cell library with a second library domain; and
saving to the computer readable memory an association between the third cell library with a second library domain.

17. A computer readable medium storing data comprising:
an integrated circuit design comprising a first block and a second block;
a first cell library;
a second cell library;
an indication that the first block is associated for synthesis with the first cell library;
an indication that the second block is associated for synthesis with the second cell library;
an indication of a constraint for imposition on the circuit design during synthesis; and
computer readable instructions for synthesizing the circuit design, including synthesizing both the first block and the second block, the instructions for performing steps comprising
in the course of synthesizing the first block, mapping a portion of the first block to a cell in the first cell library based upon the at least one constraint in view of a step of mapping a portion of the second block to a cell in the second cell library, and in the course of synthesizing the second block, mapping a portion of the second block to a cell in the second cell library based upon the at least one constraint in view of the mapping a portion of the first block to a cell in the first cell library.

18. The computer readable medium of claim 17, wherein the integrated circuit design is implemented in RTL code.

19. The computer readable medium of claim 17, wherein the integrated circuit design is implemented in a netlist.

20. A computer system comprising:

means for associating a first block of a circuit design with a first cell library;

means for associating a second block of the circuit design with a second cell library;

means for receiving at least one constraint upon the circuit design in its entirety;

means for mapping a portion of the first block to a cell in the first cell library based upon the at least one constraint in view of a step of mapping a portion of the second block to a cell in the second cell library; and means for mapping a portion of the second block to a cell in the second cell library based upon the at least one constraint in view of the step of mapping a portion of the first block to a cell in the first cell library.

* * * * *